(12) United States Patent
Lim et al.

(10) Patent No.: US 10,734,051 B2
(45) Date of Patent: Aug. 4, 2020

(54) MAGNETIC MEMORY DEVICE

(71) Applicants: SAMSUNG ELECTRONICS CO., LTD., Suwon-si, Gyeonggi-do (KR); KOREA UNIVERSITY Research and Business Foundation, Seoul (KR)

(72) Inventors: Woo Chang Lim, Seongnam-si (KR); Kyung-Jin Lee, Seoul (KR); Gyungchoon Go, Seoul (KR); Seung-Jae Lee, Seoul (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 0 days.

(21) Appl. No.: 16/591,683

(22) Filed: Oct. 3, 2019

(65) Prior Publication Data
US 2020/0035279 A1    Jan. 30, 2020

Related U.S. Application Data

(62) Division of application No. 15/822,877, filed on Nov. 27, 2017, now Pat. No. 10,482,939.

(30) Foreign Application Priority Data

Nov. 29, 2016 (KR) .................. 10-2016-0160756

(51) Int. Cl.
| | | |
|---|---|---|
| *H01L 27/22* | (2006.01) | |
| *G11C 11/16* | (2006.01) | |
| *G11C 11/15* | (2006.01) | |
| *H01L 43/08* | (2006.01) | |
| *H01L 43/02* | (2006.01) | |

(52) U.S. Cl.
CPC .............. *G11C 11/16* (2013.01); *G11C 11/15* (2013.01); *G11C 11/161* (2013.01); *G11C 11/1675* (2013.01); *G11C 11/1693* (2013.01); *H01L 27/222* (2013.01); *H01L 43/02* (2013.01); *H01L 43/08* (2013.01)

(58) Field of Classification Search
CPC ....................................................... H01L 27/22
USPC ....................................................... 365/225.5
See application file for complete search history.

(56) References Cited

U.S. PATENT DOCUMENTS

| | | | |
|---|---|---|---|
| 6,754,100 | B1 | 6/2004 | Hayakawa |
| 7,224,601 | B2 | 5/2007 | Panchula |
| 7,800,938 | B2 | 9/2010 | Rivkin et al. |
| 8,508,973 | B2 | 8/2013 | Jin et al. |
| 8,896,041 | B2 | 11/2014 | De Brosse et al. |

(Continued)

FOREIGN PATENT DOCUMENTS

| | | |
|---|---|---|
| JP | 2004-179483 A | 6/2004 |
| JP | 2009-245500 A | 10/2009 |
| JP | 2013-45840 A | 3/2013 |

*Primary Examiner* — Jason Lappas
(74) *Attorney, Agent, or Firm* — Lee IP Law, PC (57) ABSTRACT

Embodiments provide a magnetic memory device and a method of writing a magnetic memory device. The magnetic memory device includes a magnetic tunnel junction including a reference layer, a free layer and a tunnel barrier layer between the reference and free layers, and a first conductive line adjacent to the free layer. A first spin-orbit current having a frequency decreasing with time flows through the first conductive line. The writing method includes applying the first spin-orbit current having the frequency decreasing with time to the first conductive line.

13 Claims, 9 Drawing Sheets

(56) References Cited

U.S. PATENT DOCUMENTS

| | | | |
|---|---|---|---|
| 9,087,593 B2 | 7/2015 | Wang et al. | |
| 9,230,626 B2 | 1/2016 | Buhrman et al. | |
| 9,230,627 B2 | 1/2016 | Wu et al. | |
| 9,490,297 B1 * | 11/2016 | Braganca | H01L 27/222 |

* cited by examiner

MAGNETIC MEMORY DEVICE

CROSS-REFERENCE TO RELATED APPLICATIONS

This is a divisional application based on pending application Ser. No. 15/822,877, filed Nov. 27, 2017, the entire contents of which is hereby incorporated by reference.

Korean Patent Application No. 10-2016-0160756, filed on Nov. 29, 2016, in the Korean Intellectual Property Office, and entitled: "Magnetic Memory Device and Method of Writing Magnetic Memory Device," is incorporated by reference herein in its entirety.

BACKGROUND

1. Field

Embodiments of relate to a magnetic memory device and, more particularly, to a magnetic memory device using spin-orbit torque.

2. Description of the Related Art

High-speed and low-voltage memory devices have been demanded to realize high-speed and low-power electronic devices including memory devices. A magnetic memory device has been studied as a memory device satisfying these demands. The magnetic memory device has been spotlighted as a next-generation memory device because of its high-speed operation characteristic and/or non-volatile characteristic.

The magnetic memory device uses a magnetic tunnel junction (MTJ). The magnetic tunnel junction may include two magnetic layers and a tunnel barrier layer disposed between the two magnetic layers, and a resistance of the magnetic tunnel junction may be changed according to relative directions of magnetic moments of the two magnetic layers. The magnetic tunnel junction may have a high resistance when the directions of the magnetic moments of the two magnetic layers are anti-parallel to each other. On the contrary, the magnetic tunnel junction may have a low resistance when the directions of the magnetic moments of the two magnetic layers are parallel to each other. The magnetic memory device may write/sense data by using a difference between the resistances of the magnetic tunnel junction.

SUMMARY

In an aspect, a method of writing a magnetic memory device may include applying a first spin-orbit current having a frequency decreasing with time to a first conductive line in the magnetic memory device. The magnetic memory device may further include a magnetic tunnel junction including a free layer, a reference layer, and a tunnel barrier layer between the free layer and the reference layer. The first conductive line may be adjacent to the free layer.

In an aspect, a method of writing a magnetic memory device may include applying a first spin-orbit current to a first conductive line in the magnetic memory device. The magnetic memory device may further include a magnetic tunnel junction including a free layer, a reference layer, and a tunnel barrier layer between the free layer and the reference layer. The first conductive line may be adjacent to the free layer.

In an aspect, a magnetic memory device may include a magnetic tunnel junction including a free layer, a reference layer, and a tunnel barrier layer between the free layer and the reference layer, and a first conductive line adjacent to the free layer. A first spin-orbit current having a frequency decreasing with time may flow through the first conductive line. Applying the first spin-orbit current may generate at least two resonances at which a frequency of the first spin-orbit current coincides with a natural frequency of a magnetic moment of the free layer, In an aspect, a method of writing a magnetic memory device including a magnetic tunnel junction having a free layer, a reference layer, and a tunnel barrier layer between the free layer and the reference layer, and a first conductive line adjacent to the free layer. The method may include applying a first spin-orbit current including initially applying the first spin-orbit current having an initial frequency at a first time to the first conductive line and subsequently applying the first spin-orbit current having a subsequent frequency, less than the initial frequency, at a second time to the first conductive line, the second time after the first time.

BRIEF DESCRIPTION OF THE DRAWINGS

Features will become apparent to those of skill in the art by describing in detail exemplary embodiments with reference to the attached drawings in which.

DETAILED DESCRIPTION

Hereinafter, embodiments will be described on the basis of current understanding of spin-orbit interaction, spin-orbit torque, spin-transfer torque, and other physical phenomena. Thus, those of skill in the art will easily recognize that theoretical explanations of the operations of embodiments are based on the current understanding of these physical phenomena. However, embodiments are not dependent on specific physical explanation.

Hereinafter, it will be understood that, when a component is "in-plane", it may substantially exist in a plane (or surface) of a layer or a line or may be parallel to the plane (or surface). Furthermore, the term "perpendicular", when used herein, may mean a direction substantially perpendicular to a plane (or surface) of a layer or a line.

Figure 1:
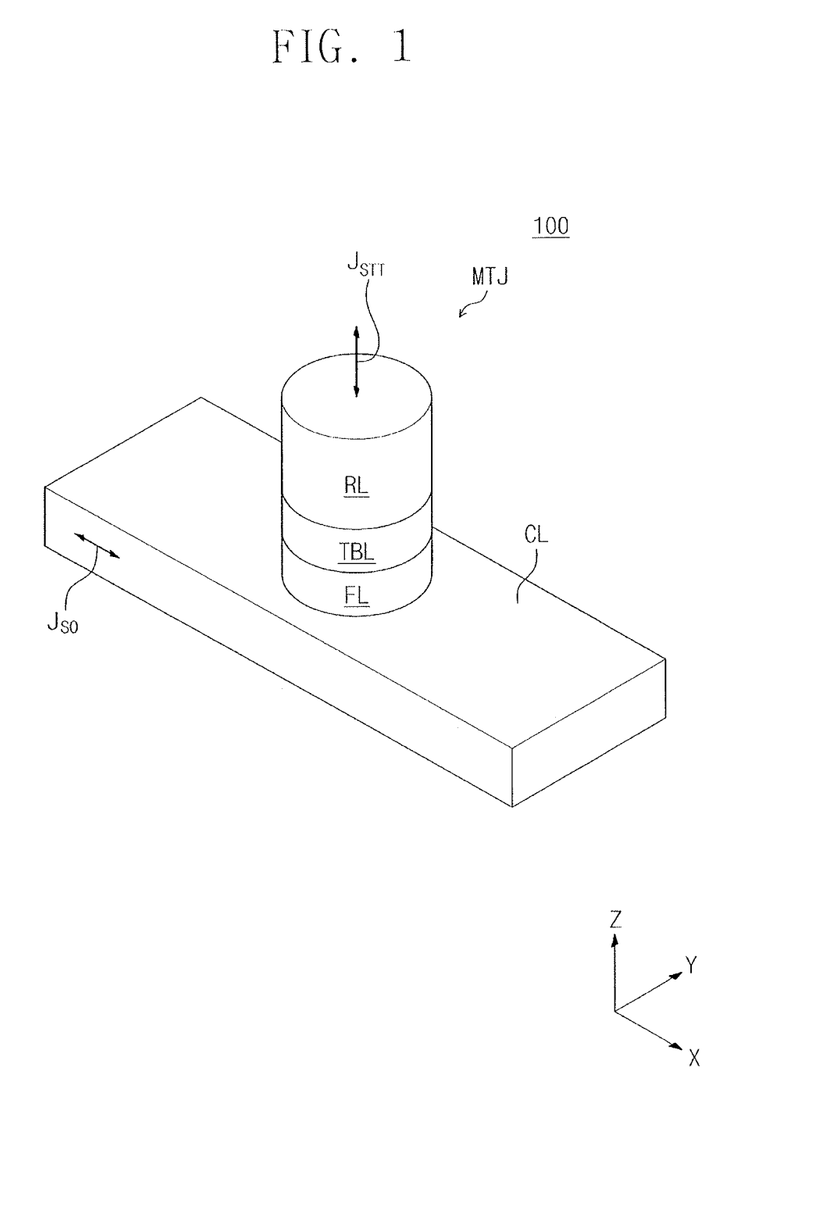
FIG. 1 illustrates a schematic view of a magnetic memory device according to some embodiments.

FIG. 1 is a schematic view illustrating a magnetic memory device according to some embodiments. FIG. 1 is provided only for understanding of some embodiments, and sizes of components illustrated in FIG. 1 are exaggerated for clarity. Some components of a magnetic memory device, e.g., bit lines, word lines, row selectors, and column selectors, are omitted in FIG. 1 for simplicity.

Referring to FIG. 1, a magnetic memory device 100 may include a magnetic tunnel junction MTJ and a conductive line CL. The magnetic tunnel junction MTJ may include a reference layer RL, a free layer FL, and a tunnel barrier layer TBL between the reference and free layers RL and FL.

The reference layer RL may have a magnetic moment fixed during a writing operation of the magnetic memory device 100. For example, the magnetic moment of the reference layer RL may not be switched by a spin-orbit torque generated by a spin-orbit current $J_{SO}$ flowing through the conductive line CL and/or a spin-transfer torque generated by a spin-transfer current $J_{STT}$ passing through the magnetic tunnel junction MTJ.

The free layer FL may have a switchable magnetic moment during the writing operation of the magnetic memory device 100. For example, the free layer FL may have the magnetic moment which can be switched to be parallel or anti-parallel to the magnetic moment of the reference layer RL. In some embodiments, the magnetic moment of the free layer FL may be switched using at least the spin-orbit torque generated by the spin-orbit current $J_{SO}$ flowing through the conductive line CL. For example, the magnetic moment of the free layer FL may be switched using only the spin-orbit torque generated by the spin-orbit current $J_{SO}$. Alternatively, the magnetic moment of the free layer FL may be switched using the spin-orbit torque and the spin-transfer torque generated by the spin-transfer current $J_{STT}$ passing through the magnetic tunnel junction MTJ. The spin-orbit current $J_{SO}$, the spin-orbit torque, the spin-transfer current $J_{STT}$, and the spin-transfer torque will be described below in more detail.

Each of the reference layer RL and the free layer FL may have an easy axis that is substantially perpendicular to a planar surface thereof. For example, the surface of the reference layer RL may be parallel to an xy-plane and the easy axis of the reference layer RL may be substantially parallel to a z-axis. Likewise, the surface of the free layer FL may be parallel to the xy-plane and the easy axis of the free layer FL may be substantially parallel to the z-axis. However, embodiments are not limited thereto.

In some embodiments, each of the reference layer RL and the free layer FL may include at least one of a material having a $L1_0$ crystal structure, a material having a hexagonal close packed (HCP) lattice, or an amorphous rare-earth transition metal (RE-TM) alloy. In an example, each of the reference layer RL and the free layer FL may include at least one of the materials having the $L1_0$ crystal structure, such as $Fe_{50}Pt_{50}$, $Fe_{50}Pd_{50}$, $Co_{50}Pt_{50}$, $Co_{50}Pd_{50}$, and $Fe_{50}Ni_{50}$. In an example, each of the reference layer RL and the free layer FL may include at least one of the materials having the HCP lattice, such as a cobalt-platinum (CoPt) disordered alloy having a platinum (Pt) content of 10 at. % to 45 at. %, and a $Co_3Pt$ ordered alloy. In an example, each of the reference layer RL and the free layer FL may include the amorphous RE-TM alloy including at least one of a rare-earth element group of terbium (Tb), dysprosium (Dy), and gadolinium (Gd), and at least one selected from a transition metal element group of iron (Fe), cobalt (Co) and nickel (Ni).

In certain embodiments, each of the reference layer RL and the free layer FL may include a material having interface perpendicular magnetic anisotropy. The interface perpendicular magnetic anisotropy means a phenomenon that a magnetic layer having an intrinsic horizontal magnetization property has a perpendicular magnetization direction by an influence of an interface between the magnetic layer and another layer adjacent to the magnetic layer. In this case, each of the reference layer RL and the free layer FL may include at least one of Co, Fe, or Ni. In addition, each of the reference layer RL and the free layer FL may further include at least one selected from non-magnetic materials including boron (B), zinc (Zn), aluminum (Al), titanium (Ti), ruthenium (Ru), tantalum (Ta), silicon (Si), silver (Ag), gold (Au), copper (Cu), carbon (C), and nitrogen (N). For example, each of the reference layer RL and the free layer FL may include CoFe or NiFe and may further include B. In addition, each of the reference layer RL and the free layer FL may further include at least one of Ti, Al, Si, magnesium (Mg), or Ta.

In some embodiments, the reference layer RL may have a single-layered structure, as illustrated in FIG. 1. Alternatively, the reference layer RL may have a synthetic antiferromagnetic structure including ferromagnetic layers separated from each other by a non-magnetic layer(s).

The tunnel barrier layer TBL may be provided between the reference layer RL and the free layer FL. The tunnel barrier layer TBL may include at least one of magnesium oxide (MgO), titanium oxide (TiO), aluminum oxide (AlO), magnesium-zinc oxide (MgZnO), magnesium-boron oxide (MgBO), titanium nitride (TiN), or vanadium nitride (VN). For example, the tunnel barrier layer TBL may include crystalline magnesium oxide (MgO).

The conductive line CL may be provided to be adjacent to the free layer FL of the magnetic tunnel junction MTJ. The conductive line CL may have a line shape extending in a first direction, e.g., an x-direction, and the magnetic tunnel junction MTJ may be on a first surface, e.g., a planar surface, of the conductive line CL. Thus, the free layer FL may be between the tunnel barrier layer TBL and the first surface of the conductive line CL.

The conductive line CL may include a material showing a strong spin-orbit interaction. For example, the conductive line CL may include at least one of copper (Cu), tantalum (Ta), platinum (Pt), tungsten (W), gadolinium (Gd), bismuth (Bi), or iridium (Ir).

The magnetic memory device 100 may be configured such that the spin-orbit current $J_{SO}$ flows through the conductive line CL. For example, the spin-orbit current $J_{SO}$ may be a current flowing in a plane of the conductive line CL. When the spin-orbit current $J_{SO}$ flows through the conductive line CL, charge carriers having polarized spins may be provided into the free layer FL. For example, when the spin-orbit current $J_{SO}$ flows in the x-direction or a −x-direction, the charge carriers having the spins polarized in a y-direction or a −y-direction may be provided into the free layer FL. This may be due to a spin-orbit interaction (e.g., a spin hole effect) occurring in the conductive line CL. The charge carriers having these polarized spins may apply torque to the magnetic moment of the free layer FL. In the present specification, the torque applied to the magnetic moment of the free layer FL due to the spin-orbit current $J_{SO}$ is defined as the spin-orbit torque.

In some embodiments, the magnetic memory device 100 may be configured to flow the spin-transfer current $J_{STT}$ passing through the magnetic tunnel junction MTJ. When the spin-transfer current $J_{STT}$ flows through the magnetic tunnel junction MTJ, charge carriers having spins polarized in a direction parallel or anti-parallel to the magnetic moment of the reference layer RL may be provided into the free layer FL. For example, when the reference layer RL has the magnetic moment in a z-direction or a −z-direction, the charge carriers having the spins polarized in the z-direction or the −z-direction may be provided into the free layer FL when the spin-transfer current $J_{STT}$ flows. The charge carriers having these polarized spins may apply torque to the magnetic moment of the free layer FL. In the present specification, the torque applied to the magnetic moment of the free layer FL due to the spin-transfer current $J_{STT}$ is defined as the spin-transfer torque.

Figure 2:
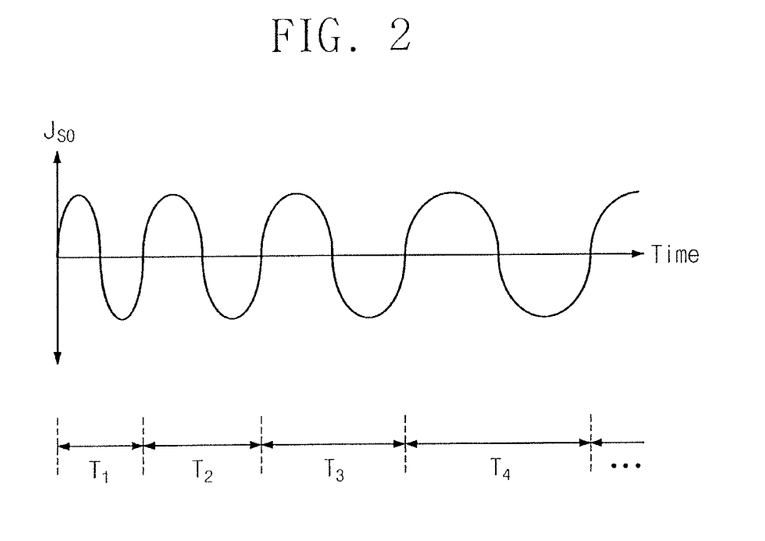
FIG. 2 illustrates a graph schematically of a spin-orbit current according to some embodiments over time.
Figure 3:
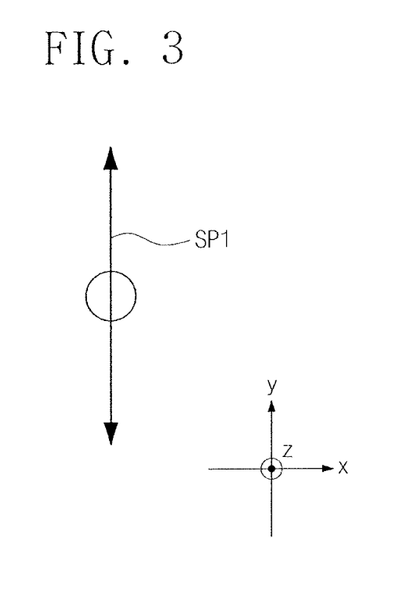
FIG. 3 schematically illustrates a spin of charge carriers provided into a free layer when the spin-orbit current according to some embodiments flows.
Figure 4A:
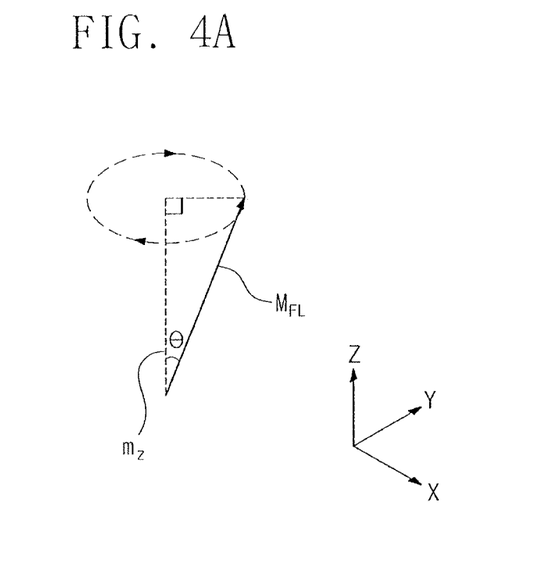
FIGS. 4A and 4B schematically illustrate precessional motions of a magnetic moment of a free layer when a spin-orbit current according to some flows.
Figure 4B:
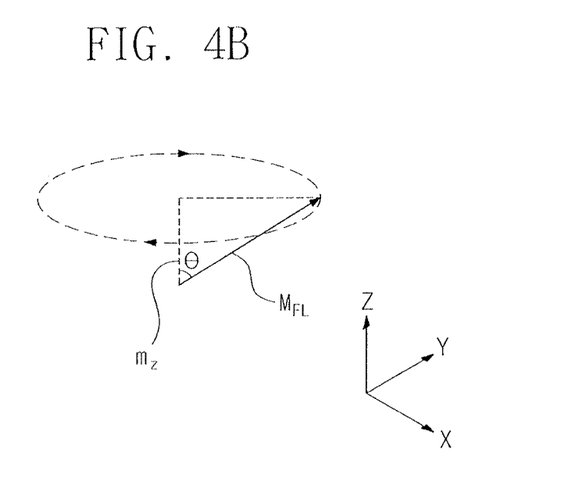
Figure 5:
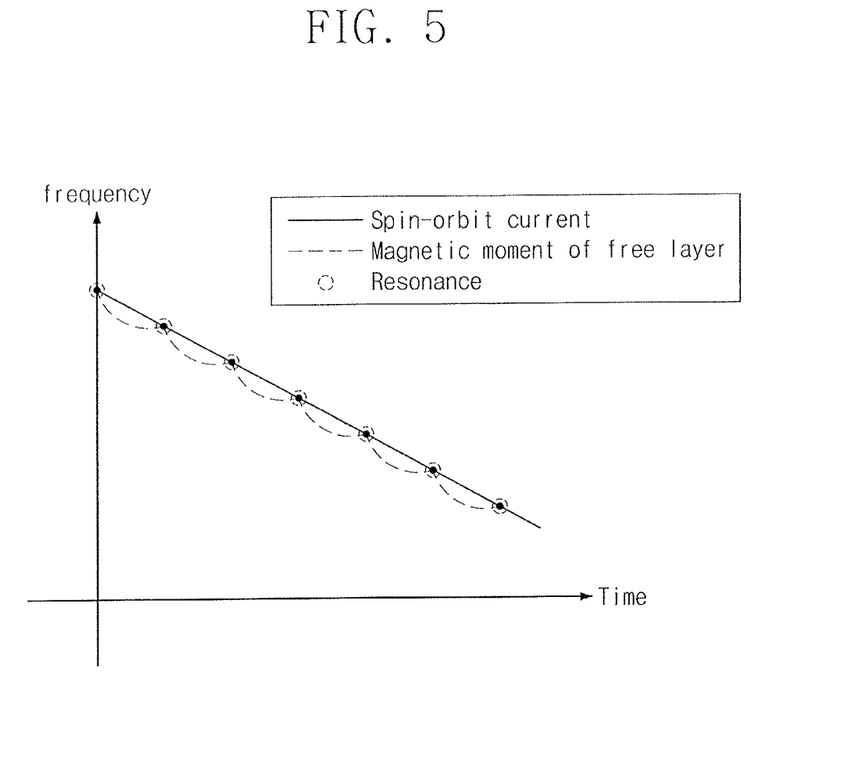
FIG. 5 illustrates a graph schematically of a frequency of a spin-orbit current and a natural frequency of a precessing magnetic moment of a free layer.

FIG. 2 is a graph schematically illustrating a spin-orbit current according to some embodiments over time. FIG. 3 schematically illustrates a spin of charge carriers provided into a free layer when the spin-orbit current according to some embodiments flows. In detail, FIG. 3 illustrates the spin of the charge carriers provided into the free layer when the spin-orbit current oscillating in the x-direction or the −x-direction flows in the conductive line CL. FIGS. 4A and 4B schematically illustrate precessional motions of a magnetic moment of a free layer when a spin-orbit current according to some embodiments flows. FIG. 5 is a graph schematically illustrating a frequency of a spin-orbit current and a natural frequency of a precessing magnetic moment of a free layer.

Referring further to FIGS. 2 and 3, the spin-orbit current $J_{SO}$ may be an alternating current (AC) of which a frequency decreases with time (e.g., in the order of $1/T_1$, $1/T_2$, $1/T_3$, $1/T_4$, ... ). For example, the spin-orbit current $J_{SO}$ may be the alternating current (e.g., having a sine waveform) which oscillates in the x-direction or the −x-direction and of which the frequency gradually decreases with time (e.g., in the order of $1/T_1$, $1/T_2$, $1/T_3$, $1/T_4$, ... ). Thus, an initial or first frequency applied at an initial time, first time, or start time is greater than a subsequent frequency or frequencies applied subsequently, e.g., a second frequency applies at a second time.

When the spin-orbit current $J_{SO}$ described above flows in the conductive line CL, the spins SP1 of the charge carriers provided into the free layer FL may oscillate in the y-direction or the −y-direction as illustrated in FIG. 3 and frequencies of the spins SP1 may be equal to the frequency of the spin-orbit current $J_{SO}$. Thus, as shown in FIG. 2, the frequencies of the spins SP1 of the charge carriers provided into the free layer FL may gradually decrease with time.

Referring further to FIGS. 4A and 4B, the spin-orbit torque due to the spin-orbit current $J_{SO}$ described above may be applied to the magnetic moment $M_{FL}$ of the free layer FL. Thus, the magnetic moment $M_{FL}$ of the free layer FL may precess around the easy axis (i.e., the z-axis) of the free layer FL.

When the frequencies of the spins SP1 of the charge carriers provided into the free layer FL (i.e., the frequency of the spin-orbit current $J_{SO}$) coincide with (or are similar to) a natural frequency of the precessing magnetic moment $M_{FL}$ of the free layer FL, resonance may occur. Thus, a rotation angle θs of the precessional motion (i.e., an angle between the easy axis and the magnetic moment $M_{FL}$ of the free layer FL) may increase rapidly, and a z-component $m_z$ of the magnetic moment $M_{FL}$ of the free layer FL may decrease rapidly. For example, the precessional motion of the magnetic moment $M_{FL}$ of the free layer FL may be changed from a state illustrated in FIG. 4A to a state illustrated in FIG. 4B.

The natural frequency of the magnetic moment $M_{FL}$ of the free layer FL may be represented by the following equation 1.

$$\omega = \gamma \frac{2K_{eff}}{M_S} m_z \qquad \text{[Equation 1]}$$

In the equation 1, "ω" denotes the natural frequency of the precessing magnetic moment $M_{FL}$ of the free layer FL, "γ" denotes a magnetic rotational constant, "$K_{eff}$" denotes an effective magnetic anisotropy energy density of the free layer FL, "$M_S$" denotes a saturation magnetization of the free layer FL, and "$m_z$" denotes the z-component $m_z$ of the magnetic moment $M_{FL}$ of the free layer FL.

Referring to the equation 1, the natural frequency ω of the magnetic moment $M_{FL}$ of the free layer FL is proportional to the z-component $m_z$ of the magnetic moment $M_{FL}$ of the free layer FL. Thus, when the z-component $m_z$ of the magnetic moment $M_{FL}$ of the free layer FL in which the resonance occurs is reduced, the natural frequency ω of the magnetic moment $M_{FL}$ is also reduced. As a result, the natural frequency of the magnetic moment $M_{FL}$ of the free layer FL may not coincide with the frequencies of the spins SP1 of the charge carriers provided into the free layer FL (i.e., the frequency of the spin-orbit current $J_{SO}$. Thus, the resonance may be broken.

If a direct current or an alternating current having a constant frequency flows through the conductive line CL, the resonance does not occur again between the magnetic moment $M_{FL}$ of the free layer FL and the spins SP1 of the charge carriers provided into the free layer FL after the resonance therebetween is broken. However, by altering the frequency of the spin-orbit current $J_{SO}$ according to some embodiments, the resonance may repeatedly occur at least two times between the magnetic moment $M_{FL}$ of the free layer FL and the spins SP1 of the charge carriers provided into the free layer FL, e.g., at least two resonances may be realized.

In more detail, referring further to FIG. 5, the spin-orbit current $J_{SO}$ according to some embodiments may have the frequency which decreases with time, as described above. Thus, even though the natural frequency of the magnetic moment $M_{FL}$ decreases to break the resonance, the frequencies of the spins SP1 of the charge carriers provided into the free layer FL may also decrease to generate the resonance again. As a result, when the spin-orbit current $J_{SO}$ according to some embodiments flows through the conductive line CL, the resonance may repeatedly occur and be broken between the magnetic moment $M_{FL}$ of the free layer FL and the spins SP1 of the charge carriers provided into the free layer FL. In other words, by decreasing the frequency of the spin-orbit current $J_{SO}$ in based on the magnetic moment of the free layer, the resonance between the magnetic moment $M_{FL}$ of the free layer FL and the spins SP1 of the charge carriers provided into the free layer FL may repeatedly occur and be broken.

The natural frequency of the magnetic moment $M_{FL}$ of the free layer FL may be smaller than the frequencies of the spins SP1 of the charge carriers provided into the free layer FL (i.e., the frequency of the spin-orbit current $J_{SO}$) between the resonances between the magnetic moment $M_{FL}$ of the free layer FL and the spins SP1 of the charge carriers provided into the free layer FL. In addition, to generate the first resonance, an initial frequency of the spin-orbit current $J_{SO}$, e.g., when the spin-orbit current starts, may be equal to or greater than an initial natural frequency of the magnetic moment $M_{FL}$ of the free layer FL when the spin-orbit current $J_{SO}$ is initially applied.

According to some embodiments, the writing operation of the magnetic memory device 100 may be performed using at least the spin-orbit torque due to the spin-orbit current $J_{SO}$ flowing through the conductive line CL. In other words, the magnetic moment $M_{FL}$ of the free layer FL may be switched using at least the spin-orbit torque due to the spin-orbit current $J_{SO}$ flowing through the conductive line CL.

In some embodiments, the magnetic moment $M_{FL}$ of the free layer FL may be switched using only the spin-orbit torque due to the spin-orbit current $J_{SO}$. According to some embodiments, since the resonance between the magnetic moment $M_{FL}$ of the free layer FL and the spins SP1 of the charge carriers provided into the free layer FL repeatedly occurs at least two times, a critical magnitude of the spin-orbit current $J_{SO}$ required to switch the magnetic moment $M_{FL}$ of the free layer FL may be relatively small, e.g., may be less than that for which only a single resonance occurs.

In certain embodiments, the magnetic moment $M_{FL}$ of the free layer FL may be switched using both the spin-orbit torque due to the spin-orbit current $J_{SO}$ and the spin-transfer torque due to the spin-transfer current $J_{STT}$. The spin-orbit current $J_{SO}$ and the spin-transfer current $J_{STT}$ may be applied at the same time for at least a certain, e.g., predetermined, period of time. In some embodiments, the spin-orbit current $J_{SO}$ may be applied prior to the spin-transfer current $J_{STT}$. However, embodiments are not limited thereto.

Since the spin-orbit torque is due to the spins polarized in the y-direction or the −y-direction, the strength of the spin-orbit torque applied to the magnetic moment $M_{FL}$ of the free layer FL may increase as the magnetic moment $M_{FL}$ of the free layer FL becomes closer to the z-direction or the −z-direction. On the other hand, since the spin-transfer torque is due to the spins polarized in the z-direction or the −z-direction, the strength of the spin-transfer torque applied to the magnetic moment $M_{FL}$ of the free layer FL may increase as the magnetic moment $M_{FL}$ of the free layer FL becomes closer to the xy plane. In other words, the spin-orbit torque may be more efficient or effective to switch the magnetic moment $M_{FL}$ of the free layer FL when the magnetic moment $M_{FL}$ of the free layer FL is closer to the z-direction or the −z-direction, while the spin-transfer torque may be more efficient or effective to switch the magnetic moment $M_{FL}$ of the free layer FL when the magnetic moment $M_{FL}$ of the free layer FL is closer to the xy plane.

Thus, in an initial stage of the switching operation, the spin-orbit torque may act as main switching torque to tilt the magnetic moment $M_{FL}$ of the free layer FL toward the xy plane. According to some embodiments, since the resonance between the magnetic moment $M_{FL}$ of the free layer FL and the spins SP1 of the charge carriers repeatedly occurs at least two times, the magnetic moment $M_{FL}$ of the free layer FL may be effectively tilted toward the xy plane by using the spin-orbit current $J_{SO}$ having a relatively small magnitude. Thereafter, when the magnetic moment $M_{FL}$ of the free layer FL is closer to the xy plane, the spin-transfer torque may act as main switching torque to finally switch the magnetic moment $M_{FL}$ of the free layer FL.

Figure 6:
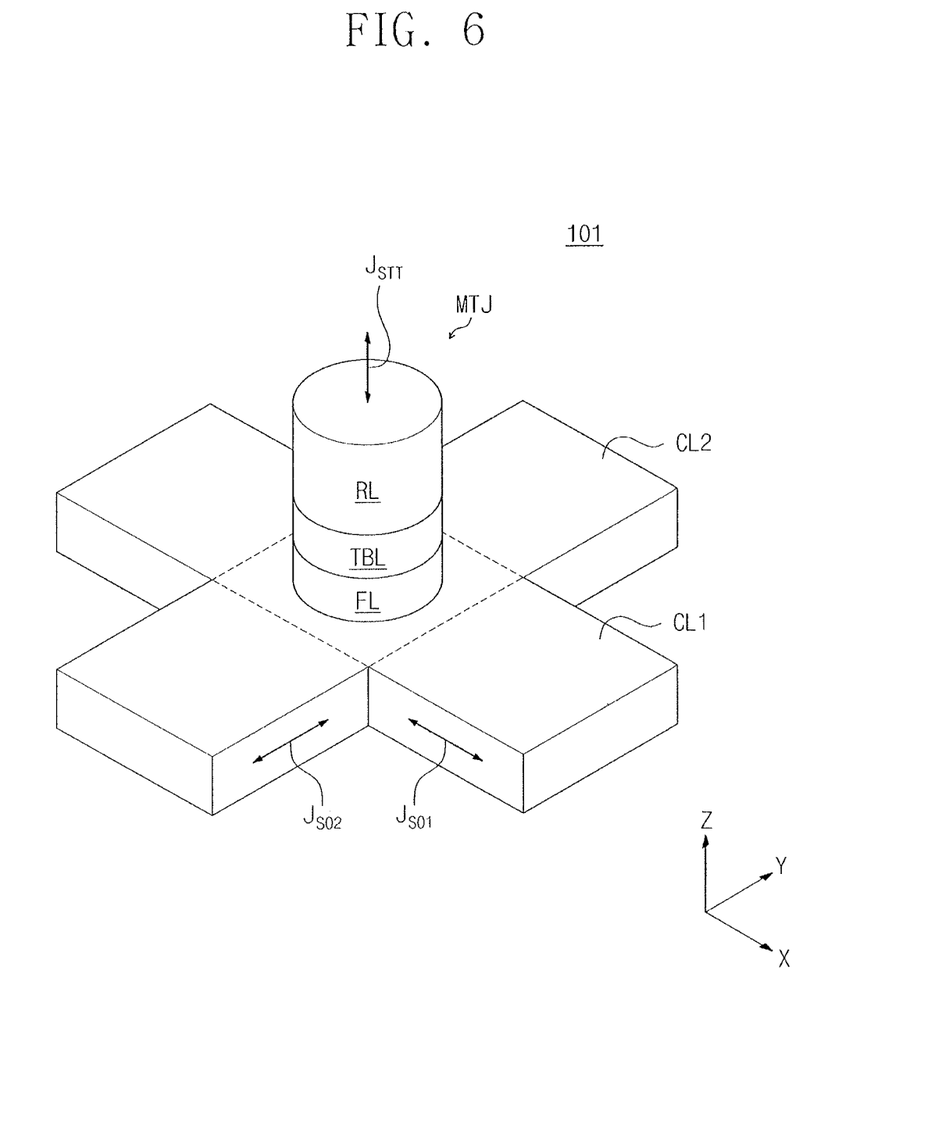
FIG. 6 illustrates a schematic view of a magnetic memory device according to some embodiments.

FIG. 6 is a schematic view illustrating a magnetic memory device according to some embodiments. FIG. 6 is provided only for understanding of some embodiments, and sizes of components illustrated in FIG. 6 are exaggerated for clarity. Some components of a magnetic memory device, e.g., bit lines, word lines, row selectors, and column selectors, are omitted in FIG. 1 for simplicity.

Referring to FIG. 6, a magnetic memory device 101 may include a magnetic tunnel junction MTJ, a first conductive line CL1, and a second conductive line CL2. The magnetic tunnel junction MTJ may be the substantially same as described with reference to FIG. 1. Thus, detailed descriptions to the magnetic tunnel junction MTJ will be omitted.

The first conductive line CL1 may have a line shape extending in an x-direction. The second conductive line CL2 may have a line shape intersecting the first conductive line CL1. For example, the second conductive line CL2 may have a line shape extending in a y-direction.

The first conductive line CL1 and the second conductive line CL2 may cross each other at one portion and may be connected to each other. For example, the first conductive line CL1 and the second conductive line CL2 may be disposed in the same plane (i.e., an xy plane).

The magnetic tunnel junction MTJ may be on the intersecting portion of the first and second conductive lines CL1 and CL2. The free layer FL of the magnetic tunnel junction MTJ may be adjacent to the crossing point of the first and second conductive lines CL1 and CL2. Thus, the free layer FL may be between the tunnel barrier layer TBL and the intersecting portion of the first and second conductive lines CL1 and CL2.

Each of the first and second conductive lines CL1 and CL2 may include a material showing a strong spin-orbit interaction. For example, each of the first and second conductive lines CL1 and CL2 may include at least one of Cu, Ta, Pt, W, Gd, Bi, or Ir.

The magnetic memory device 101 may be configured to flow a first spin-orbit current $J_{SO1}$ in the first conductive line CL and to flow a second spin-orbit current $J_{SO2}$ in the second conductive line CL2. For example, the first spin-orbit current $J_{SO1}$ may be a current flowing in a plane of the first conductive line CL1, and the second spin-orbit current $J_{SO2}$ may be a current flowing in a plane of the second conductive line CL2.

When the first spin-orbit current $J_{SO1}$ flows in the x-direction or a −x-direction, charge carriers having spins polarized in the y-direction or a −y-direction may be provided into the free layer FL. When the second spin-orbit current $J_{SO2}$ flows in the y-direction or the −y-direction, charge carriers having spins polarized in the x-direction or the −x-direction may be provided into the free layer FL. This may be due to a spin-orbit interaction (e.g., a spin hole effect) occurring in the conductive line CL1 or CL2. The charge carriers having these polarized spins may apply torque to the magnetic moment of the free layer FL.

In some embodiments, the magnetic memory device 101 may be configured to flow the spin-transfer current $J_{STT}$ passing through the magnetic tunnel junction MTJ. When the spin-transfer current $J_{STT}$ flows through the magnetic tunnel junction MTJ, charge carriers having spins polarized in a direction parallel or anti-parallel to the magnetic moment of the reference layer RL may be provided into the free layer FL. For example, in a case in which the reference layer RL has the magnetic moment in a z-direction or a −z-direction, the charge carriers having the spins polarized in the z-direction or the −z-direction may be provided into the free layer FL when the spin-transfer current $J_{STT}$ flows. The charge carriers having these polarized spins may apply torque to the magnetic moment of the free layer FL.

Figure 7A:
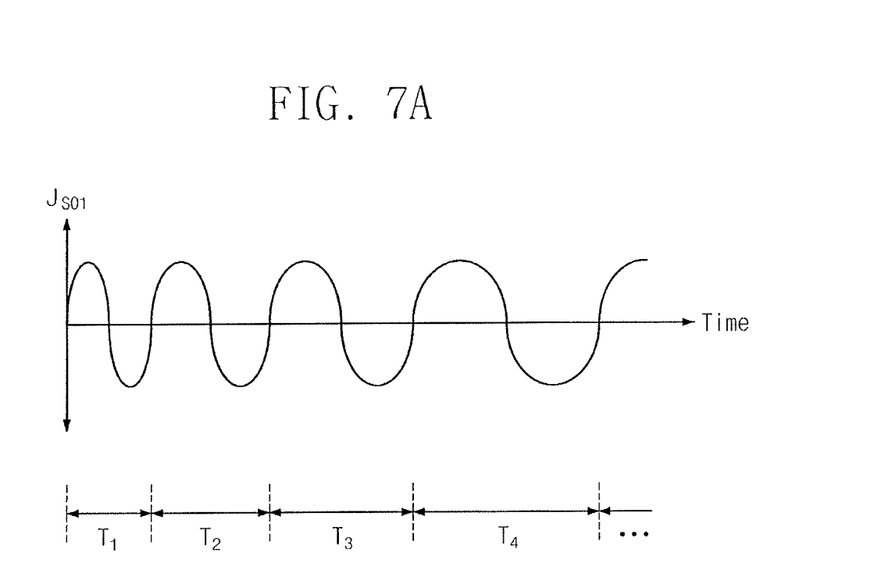
FIG. 7A illustrates a graph schematically of a first spin-orbit current according to some embodiments over time.
Figure 7B:
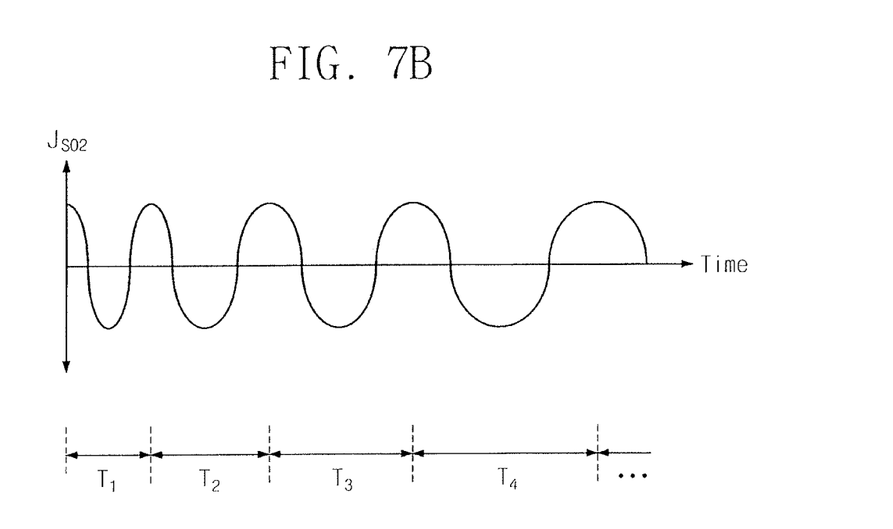
FIG. 7B illustrates a graph schematically of a second spin-orbit current according to some embodiments over time.
Figure 8:
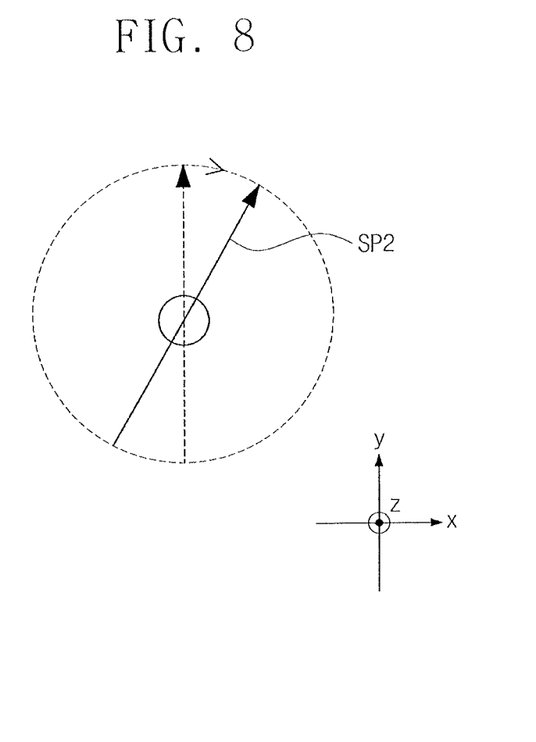
FIG. 8 schematically illustrates a spin of charge carriers provided into a free layer when the first and second spin-orbit currents according to some embodiments flow.

FIG. 7A is a graph schematically illustrating a first spin-orbit current according to some embodiments over time. FIG. 7B is a graph schematically illustrating a second spin-orbit current according to some embodiments over time. FIG. 8 schematically illustrates a spin of charge carriers provided into a free layer when the first and second spin-orbit currents according to some embodiments flow. In detail, FIG. 8 illustrates the spin of the charge carriers provided into the free layer when the first spin-orbit current oscillating in the x-direction or the −x-direction and the second spin-orbit current oscillating in the y-direction or the −y-direction flow.

Referring further to FIGS. 7A, 7B, and 8, each of the first and second spin-orbit currents $J_{SO1}$ and $J_{SO2}$ may be an alternating current (AC) of which a frequency decreases with time (e.g., in the order of $1/T_1$, $1/T_2$, $1/T_3$, $1/T_4$, . . . ). For example, the first spin-orbit current $J_{SO1}$ may be the alternating current (e.g., having a sine waveform) which oscillates in the x-direction or the −x-direction and of which the frequency gradually decreases with time (e.g., in the order of $1/T_1$, $1/T_2$, $1/T_3$, $1/T_4$, . . . ). For example, the second spin-orbit current $J_{SO2}$ may be the alternating current (e.g., having a cosine waveform) which oscillates in the y-direction or the −y-direction and of which the frequency gradually decreases with time (e.g., in the order of $1/T_1$, $1/T_2$, $1/T_3$, $1/T_4$, . . . ). The frequency of the first spin-orbit current $J_{SO1}$ may be equal to the frequency of the second spin-orbit current $J_{SO2}$. For example, the frequency of the first spin-orbit current $J_{SO1}$ may be equal to the frequency of the second spin-orbit current $J_{SO2}$, while the periods thereof may be offset, e.g., by a quarter wavelength.

When the first and second spin-orbit currents $J_{SO1}$ and $J_{SO2}$ described above flow, spins SP2 of the charge carriers provided into the free layer FL may oscillate (or rotate) in the xy plane, and frequencies of the oscillating (or rotating) spins SP2 may be equal to the frequencies of the first and second spin-orbit currents $J_{SO1}$ and $J_{SO2}$. Thus, the frequencies of the spins SP2 of the charge carriers provided into the free layer FL may gradually decrease with time. For example, the spins SP2 of the charge carriers provided into the free layer FL may circularly rotate in the xy plane as illustrated in FIG. 8, and the frequencies of the spins SP2 may be equal to the frequencies of the first and second spin-orbit currents $J_{SO1}$ and $J_{SO2}$.

As described with reference to FIGS. 4A and 4B, the spin-orbit torque due to the first and second spin-orbit currents $J_{SO1}$ and $J_{SO2}$ may be applied to the magnetic moment $M_{FL}$ of the free layer FL. Thus, the magnetic moment $M_{FL}$ of the free layer FL may precess around the easy axis (i.e., the z-axis) of the free layer FL.

When the frequencies of the spins SP2 of the charge carriers provided into the free layer FL (i.e., the frequencies of the first and second spin-orbit currents $J_{SO1}$ and $J_{SO2}$) coincide with (or are similar to) the natural frequency of the precessing magnetic moment $M_{FL}$ of the free layer FL, resonance may occur. Thus, the rotation angle θ of the precessional motion may increase rapidly, and the z-component $m_z$ of the magnetic moment $M_{FL}$ of the free layer FL may decrease rapidly. For example, the precessional motion of the magnetic moment $M_{FL}$ of the free layer FL may be changed from the state illustrated in FIG. 4A to the state illustrated in FIG. 4B.

Since the natural frequency of the magnetic moment $M_{FL}$ of the free layer FL is proportional to the z-component $m_z$ of the magnetic moment $M_{FL}$ of the free layer FL as described with reference to the equation 1, the natural frequency of the magnetic moment $M_{FL}$ of the free layer FL may be reduced by the occurrence of the resonance. As a result, the frequencies of the spins SP2 of the charge carriers provided into the free layer FL (i.e., the frequencies of the first and second spin-orbit currents $J_{SO1}$ and $J_{SO2}$) may become different from the natural frequency of the magnetic moment $M_{FL}$ of the free layer FL, and thus the resonance is broken.

However, since the first and second spin-orbit currents $J_{SO1}$ and $J_{SO2}$ have the frequencies decreasing with time as described with reference to FIGS. 7A and 7B, the resonance between the magnetic moment $M_{FL}$ of the free layer FL and the spins SP2 of the charge carriers provided into the free layer FL may repeatedly occur at least two times. In detail, even though the natural frequency of the magnetic moment $M_{FL}$ decreases to break the resonance, the resonance may occur again since the frequencies of the spins SP2 of the charge carriers provided into the free layer FL also decrease.

The natural frequency of the magnetic moment $M_{FL}$ of the free layer FL may be smaller than the frequencies of the spins SP2 of the charge carriers provided into the free layer FL (i.e., the frequencies of the first and second spin-orbit currents $J_{SO1}$ and $J_{SO2}$) between the resonances. In addition, to generate the first resonance, initial frequencies of the first and second spin-orbit currents $J_{SO1}$ and $J_{SO2}$ may be equal to or greater than the initial natural frequency of the magnetic moment $M_{FL}$ of the free layer FL.

According to some embodiments, a writing operation of the magnetic memory device 101 may be performed using at least the spin-orbit torque due to the first and second spin-orbit currents $J_{SO1}$ and $J_{SO2}$ flowing through the first and second conductive lines CL1 and CL2. In other words, the magnetic moment $M_{FL}$ of the free layer FL may be switched using at least the spin-orbit torque due to the first and second spin-orbit currents $J_{SO1}$ and $J_{SO2}$ flowing through the first and second conductive lines CL1 and CL2.

In some embodiments, the magnetic moment $M_Lt$ of the free layer FL may be switched using only the spin-orbit torque due to the first and second spin-orbit currents $J_{SO1}$ and $J_{SO2}$. According to some embodiments, since the resonance between the magnetic moment $M_{FL}$ of the free layer FL and the spins SP2 of the charge carriers provided into the free layer FL repeatedly occurs at least two times, critical magnitudes of the first and second spin-orbit currents $J_{SO1}$ and $J_{SO2}$ required to switch the magnetic moment $M_{FL}$ of the free layer FL may be relatively small, e.g., may be less than that for which only a single resonance occurs.

In certain embodiments, the magnetic moment $M_{FL}$ of the free layer FL may be switched using both the spin-orbit torque due to the first and second spin-orbit currents $J_{SO1}$ and $J_{SO2}$ and the spin-transfer torque due to the spin-transfer current $J_{STT}$. The first and second spin-orbit currents $J_{SO1}$ and $J_{SO2}$ and the spin-transfer current $J_{STT}$ may be applied at the same time for at least a certain period of time. In some embodiments, the first and second spin-orbit currents $J_{SO1}$ and $J_{SO2}$ may be applied prior to the spin-transfer current $J_{STT}$. However, embodiments of are not limited thereto.

In the present embodiment, in an initial stage of the switching operation, the spin-orbit torque may act as main switching torque to tilt the magnetic moment $M_{FL}$ of the free layer FL toward the xy plane. According to some embodiments, since the resonance between the magnetic moment $M_{FL}$ of the free layer FL and the spins SP2 of the charge carriers repeatedly occurs at least two times, the magnetic moment $M_{FL}$ of the free layer FL may be effectively tilted toward the xy plane by using the first and second spin-orbit currents $J_{SO1}$ and $J_{SO2}$ having the relatively small magnitudes. Thereafter, when the magnetic moment $M_{FL}$ of the free layer FL is closer to the xy plane, the spin-transfer torque may act as main switching torque to finally switch the magnetic moment $M_{FL}$ of the free layer FL.

Figure 9A:
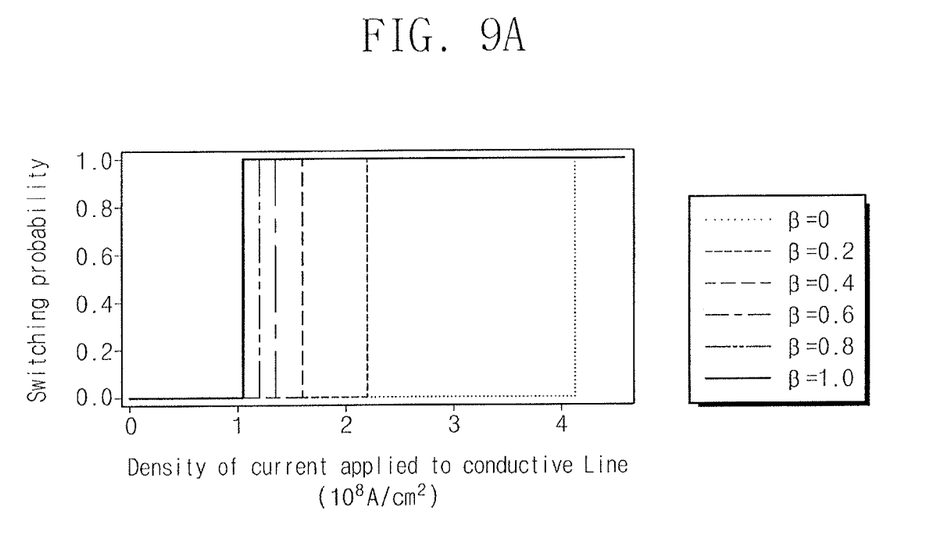
FIG. 9A illustrates a graph of a switching critical current when a direct current is applied to a conductive line adjacent to a free layer.
Figure 9B:
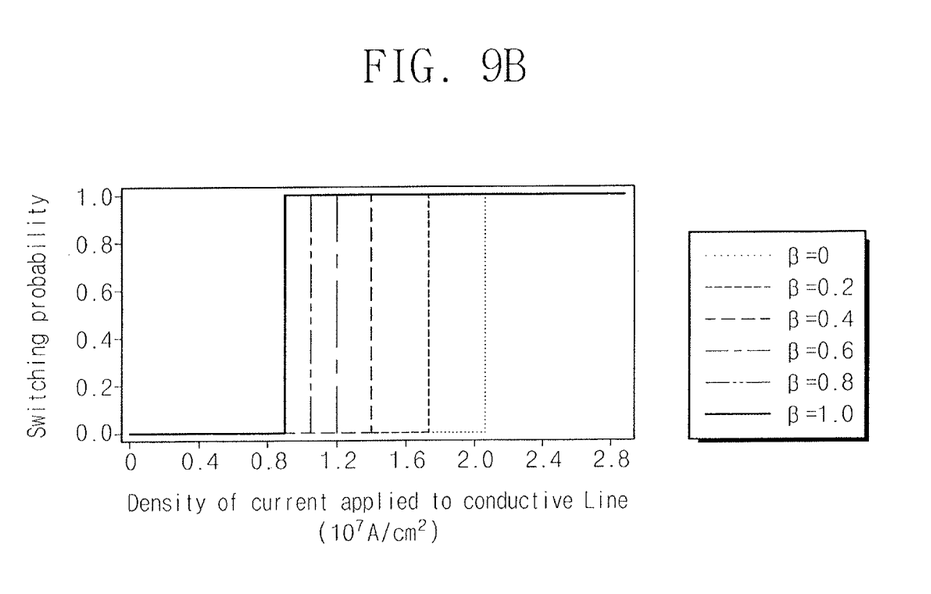
FIGS. 9B and 9C illustrate graphs of a switching critical current when a current having an alternating current (AC) form according to some embodiments is applied to a conductive line adjacent to a free layer.
Figure 9C:
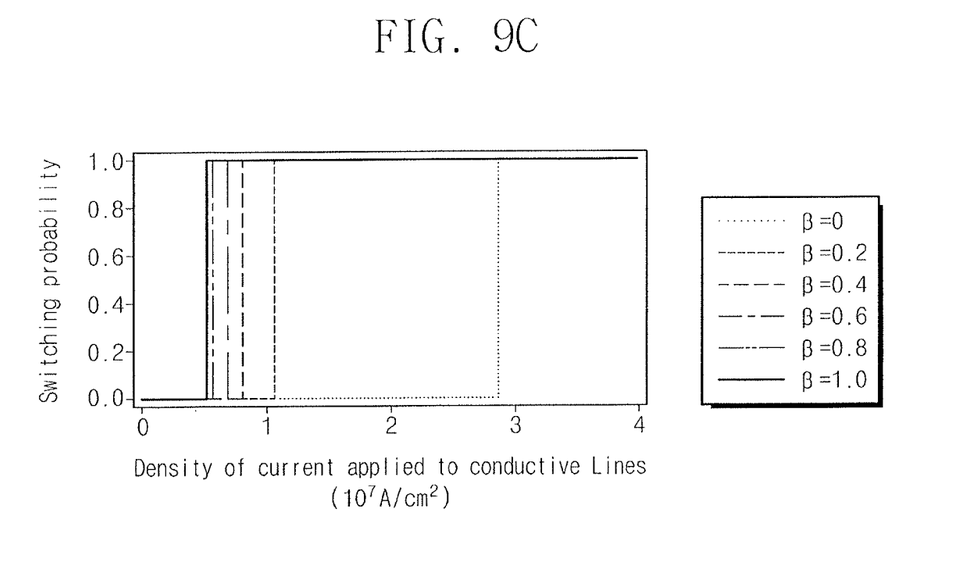

FIG. 9A is a graph illustrating a switching critical current when a direct current (DC) is applied to a conductive line adjacent to a free layer. FIGS. 9B and 9C are graphs illustrating a switching critical current when an alternating current (AC) according to some embodiments is applied to a conductive line adjacent to a free layer.

In detail, FIG. 9A illustrates simulation results of a switching critical current when an external magnetic field of 200 Oe is applied to the free layer FL of the magnetic memory device 100 of FIG. 1 in the x-direction and a current pulse having a rise time of 0.5 ns is applied to the conductive line CL of the magnetic memory device 100. The spin-transfer current $J_{STT}$ is not applied to the magnetic memory device 100.

FIG. 9B illustrates simulation results of a switching critical current when the spin-transfer current $J_{STT}$ of $6 \times 10^5$ A/cm$^2$ is applied to the magnetic memory device 100 of FIG. 1 and an alternating current having the frequency decreasing with time is applied to the conductive line CL of the magnetic memory device 100. An external magnetic field is not applied to the free layer FL of the magnetic memory device 100. The frequency of the alternating currents used in FIG. 9B was $\omega_0 - 2\pi\xi t$ ($\xi = 1.5 \times 10^{18}/s^2$) where $\omega$ is an initial frequency that is greater than or equal to the initial natural frequency of the magnetic moment of the free layer and t is time.

FIG. 9C illustrates simulation results of a switching critical current when alternating currents having frequencies decreasing with time are applied to the first and second conductive lines CL1 and CL2 in the magnetic memory device 101 illustrated in FIG. 6. An external magnetic field and/or a spin-transfer current were not applied in FIG. 9C. The frequencies of the alternating currents used in FIG. 9C was $\omega_0 - 2\pi\xi t$ ($\xi = 1.5 \times 10^{18}/s^2$).

Except for the structure of the conductive line(s), the current applied to the conductive line(s), the external magnetic field and/or the spin-transfer conductive line described above, other conditions of FIGS. 9A to 9C were the same as each other. In detail, an area of the free layer was $\pi \times 15^2$ nm$^2$, a thickness of the free layer was 2 nm, the effective magnetic anisotropy energy density $K_{eff}$ was $2.2 \times 10^6$ erg/cm$^3$, the saturation magnetization $M_s$ was 1000 emu/cm$^3$, a Gilbert damping constant $\alpha$ was 0.01, a spin hole angle $\theta_{SH}$ was 0.3, and non-adiabaticity parameters $\beta$ in a range of 0 to 1 were used.

Referring to FIG. 9A, the switching critical current ranges from about $10^8$ A/cm$^2$ to about $4 \times 10^8$ A/cm$^2$ and decreases as the non-adiabaticity parameter $\beta$ increases.

Referring to FIG. 9B, the switching critical current ranges from about $0.9 \times 10^7$ A/cm$^2$ to about $2 \times 10^7$ A/cm$^2$ and decreases as the non-adiabaticity parameter $\beta$ increases.

Referring to FIG. 9C, the switching critical current ranges from about $0.5 \times 10^7$ A/cm$^2$ to about $2.9 \times 10^7$ A/cm$^2$ and decreases as the non-adiabaticity parameter $\beta$ increases.

Comparing FIG. 9A with FIG. 9B, even though the external magnetic field conditions and/or spin-transfer current conditions of FIGS. 9A and 9B are different from each other, the switching critical current when applying the current described with reference to FIGS. 1 and 2 to the conductive line is as small as about 1/10 to about 1/20 of the switching critical current when applying the direct current to the conductive line.

Comparing FIG. 9A with FIG. 9C, even though the external magnetic field does not exist, the switching critical current when applying the currents described with reference to FIGS. 6, 7A, and 7B to the conductive lines is as small as about 1/20 to about 3/40 of the switching critical current when applying the direct current to the conductive line.

According to some embodiments, the method of writing the magnetic memory device may be performed using at least the spin-orbit current flowing through the conductive line having a decreasing frequency. Thus, the magnitude of the spin-orbit current required during the writing operation of the magnetic memory device may be relatively small, e.g., may be less than that for which only a single resonance occurs.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A magnetic memory device, comprising:
a magnetic tunnel junction including a free layer, a reference layer, and a tunnel barrier layer between the free layer and the reference layer; and
a first conductive line adjacent to the free layer,
wherein, during writing to the magnetic memory device, a first spin-orbit current, which is an alternating current having a frequency that decreases in a fixed manner over time during the writing, flows through the first conductive line.

2. The magnetic memory device as claimed in claim 1, wherein the first spin-orbit current that flows through the first conductive line applies a spin-orbit torque to a magnetic moment of the free layer.

3. The magnetic memory device as claimed in claim 2, wherein the magnetic moment of the free layer is switched using at least the spin-orbit torque.

4. The magnetic memory device as claimed in claim 3, wherein the magnetic moment of the free layer is switched further using spin-transfer torque generated by a spin-transfer current passing through the magnetic tunnel junction.

5. The magnetic memory device as claimed in claim 1, wherein the free layer is between the tunnel barrier layer and a first surface of the first conductive line.

6. The magnetic memory device as claimed in claim 1, wherein the free layer has an easy axis substantially perpendicular to a surface of the free layer.

7. The magnetic memory device as claimed in claim 1, wherein the first conductive line includes at least one of copper, tantalum, platinum, tungsten, gadolinium, bismuth or iridium.

8. A magnetic memory device, comprising:
a magnetic tunnel junction including a free layer, a reference layer, and a tunnel barrier layer between the free layer and the reference layer;
a first conductive line adjacent to the free layer, and
a second conductive line intersecting the first conductive line, wherein, during writing to the magnetic memory device,
a first spin-orbit current having a frequency decreasing with time flows through the first conductive line, and
wherein a second spin-orbit current having a frequency decreasing with time flows through the second conductive line.

9. The magnetic memory device as claimed in claim 8, wherein the magnetic tunnel junction is on an intersecting portion of the first and second conductive lines.

10. The magnetic memory device as claimed in claim 8, wherein the frequency of the second spin-orbit current is equal to the frequency of the first spin-orbit current.

11. A magnetic memory device, comprising:
a magnetic tunnel junction including a free layer, a reference layer, and a tunnel barrier layer between the free layer and the reference layer; and
a first conductive line adjacent to the free layer,
wherein, during writing to the magnetic memory device,
a first spin-orbit current, which is an alternating current having a frequency flows through the first conductive line, and
wherein the first spin-orbit current generates at least two resonances at which a frequency of the first spin-orbit current coincides with a natural frequency of a magnetic moment of the free layer.

12. The magnetic memory device as claimed in claim 11, wherein the frequency of the first spin-orbit current is greater than the natural frequency of the magnetic moment of the free layer between the at least two resonances.

13. The magnetic memory device as claimed in claim 11, wherein the frequency of the first spin-orbit decreases in a fixed manner over time during the writing.

* * * * *

UNITED STATES PATENT AND TRADEMARK OFFICE
CERTIFICATE OF CORRECTION

PATENT NO. : 10,734,051 B2  
APPLICATION NO. : 16/591683  
DATED : August 4, 2020  
INVENTOR(S) : Woo Chang Lim et al.

Page 1 of 1

It is certified that error appears in the above-identified patent and that said Letters Patent is hereby corrected as shown below:

(73) Should Read:  
--Samsung Electronics Co., Ltd.  
Suwon-si, Gyeonggi-do, (KR)  
and  
Korean University Research and  
Business Foundation  
Seoul, (KR)--

Signed and Sealed this  
Twenty-third Day of March, 2021

Drew Hirshfeld  
*Performing the Functions and Duties of the*  
*Under Secretary of Commerce for Intellectual Property and*  
*Director of the United States Patent and Trademark Office*